United States Patent [19]

Kufis et al.

[11] Patent Number: 4,791,364

[45] Date of Patent: Dec. 13, 1988

[54] THERMAL FIXTURE FOR TESTING INTEGRATED CIRCUITS

[75] Inventors: James C. Kufis; Robert S. Semken, both of Sunnyvale, Calif.

[73] Assignee: Thermonics Incorporated, Santa Clara, Calif.

[21] Appl. No.: 144,606

[22] Filed: Jan. 11, 1988

Related U.S. Application Data

[63] Continuation of Ser. No. 767,522, Aug. 20, 1985, abandoned.

[51] Int. Cl.[4] ............................................. G01R 31/02
[52] U.S. Cl. ............................. 324/158 F; 324/158 P
[58] Field of Search ............ 324/158 F, 158 P, 158 R, 324/73 PC

[56] References Cited

U.S. PATENT DOCUMENTS

| | | | |
|---|---|---|---|
| 3,039,604 | 6/1962 | Bickel et al. | 324/73 AT |
| 3,710,251 | 1/1973 | Hagge et al. | 324/158 F |
| 3,979,671 | 9/1976 | Meeker et al. | 324/158 F |
| 4,115,736 | 9/1978 | Tracy | 324/158 F |
| 4,520,312 | 5/1985 | Tarng et al. | 324/158 F |
| 4,528,504 | 7/1985 | Thornton, Jr. et al. | 324/158 F |
| 4,588,092 | 5/1986 | Moechnig et al. | 324/158 F |

OTHER PUBLICATIONS

Oktay et al.; "Counter-Flow Air . . . "; IBM Tech. Dis. Bull.; vol. 22; No. 2; Jul. 1979; pp. 589-590.

Primary Examiner—Ernest F. Karlsen
Attorney, Agent, or Firm—Thomas E. Schatzel

[57] ABSTRACT

A device for individually testing semiconductor integrated circuits in wafer form at elevated and/or reduced temperatures include a fixture body for connection to a conventional probing device. The fixture body has an open-ended aperture to permit visual inspection of a circuit being tested, a plenum to receive pressurized gas at a selected temperature(s), and nozzles to direct the gas from the plenum into the aperture for ejection onto the surface of the integrated circuit being tested to rapidly bring that circuit to the temperature of the gas.

9 Claims, 3 Drawing Sheets

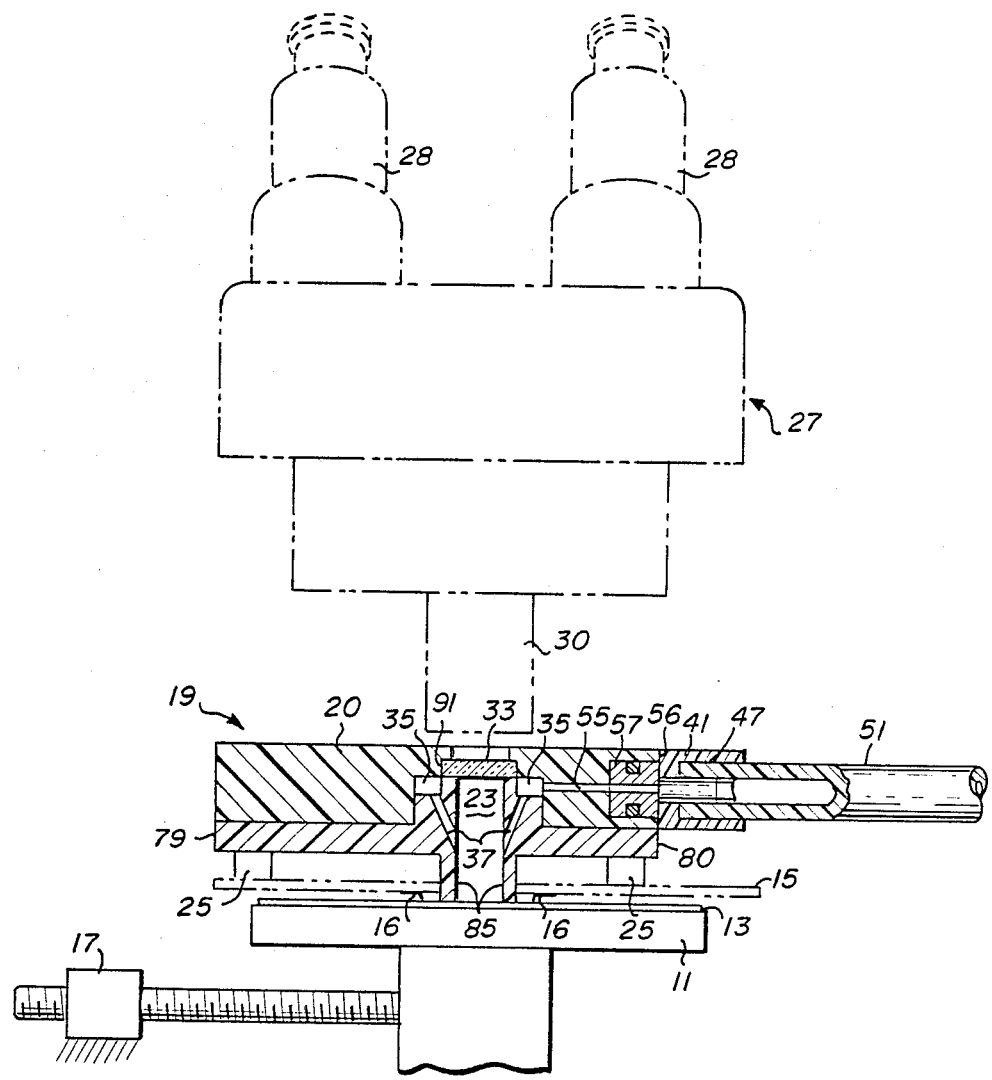
Fig_1

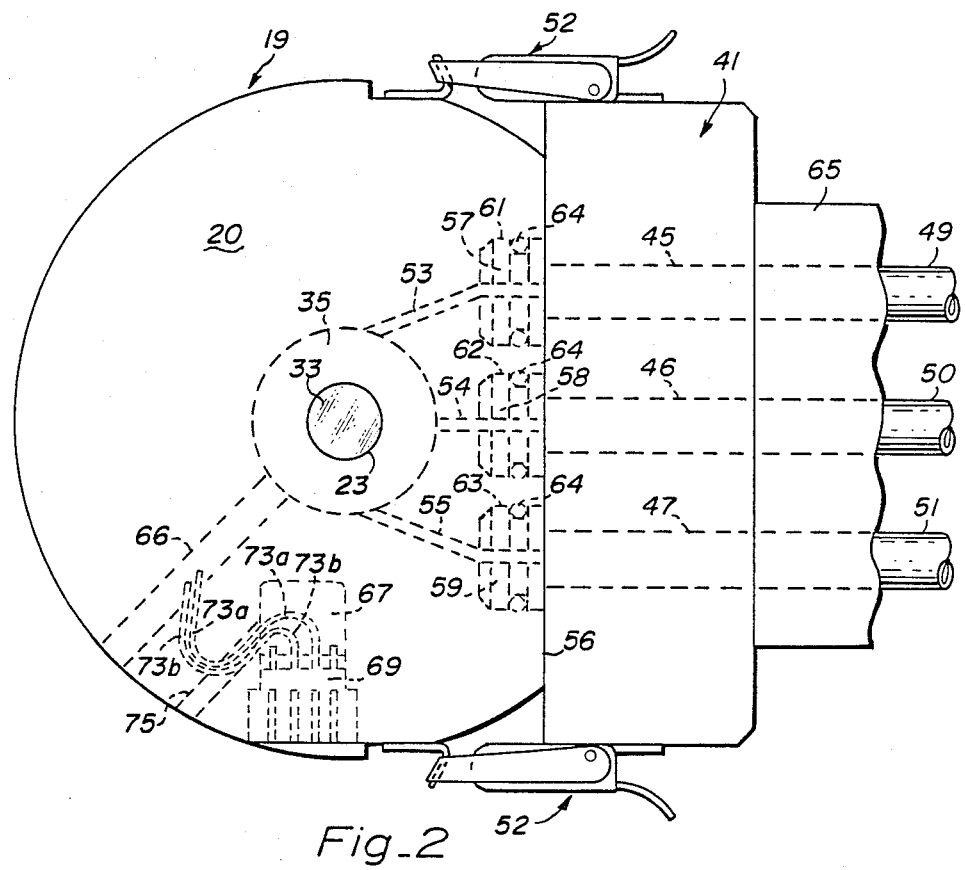
Fig_2
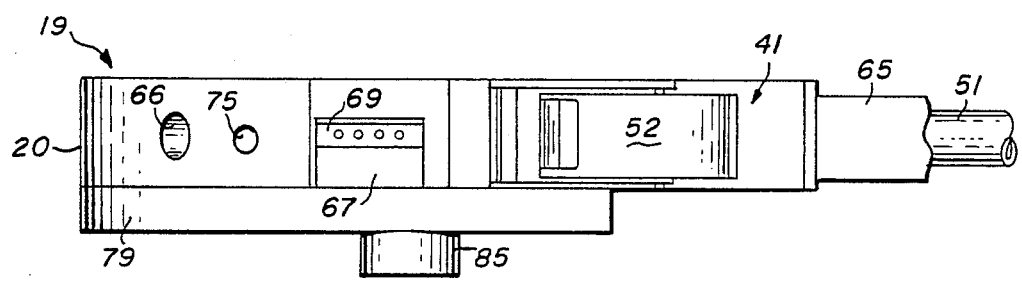
Fig_3

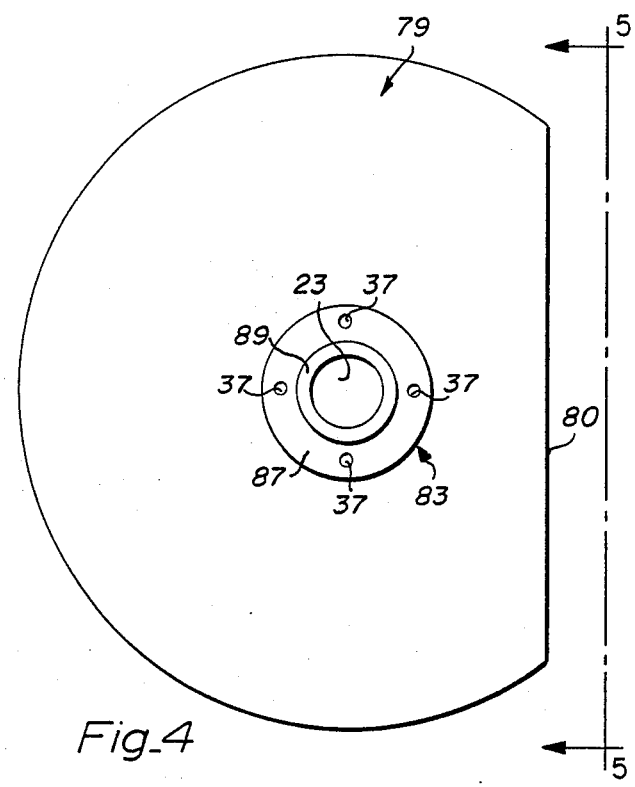
Fig_4
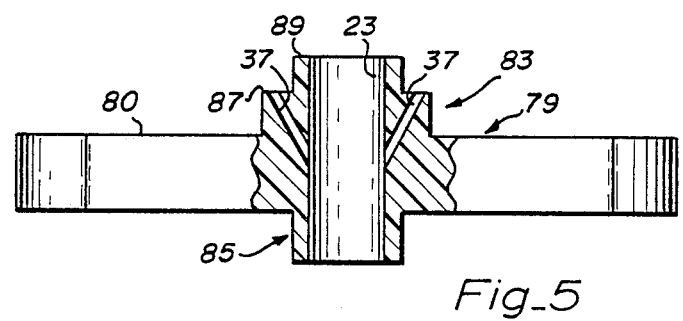
Fig_5
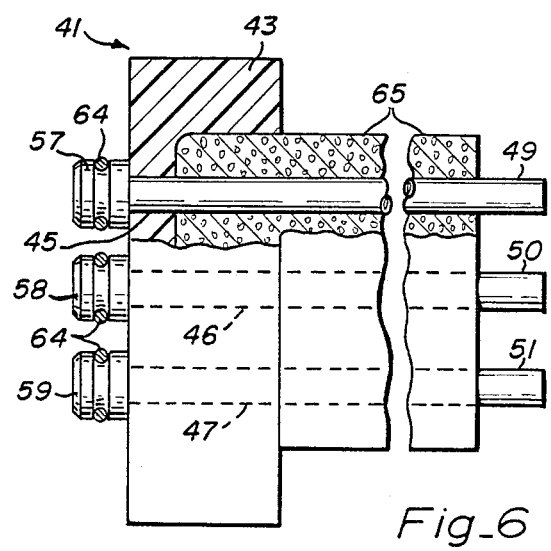
Fig_6

THERMAL FIXTURE FOR TESTING INTEGRATED CIRCUITS

This is a continuation of co-pending application Ser. No. 767,522 filed on Aug. 20, 1985, now abandoned.

BACKGROUND OF INVENTION

1. Field of the Invention

The present invention relates to a device for testing integrated circuits and, more particularly, to a device for testing integrated circuits in semiconductor wafer form at temperatures elevated or reduced from room temperature.

2. Description of the Art

In the manufacture of integrated electronic semiconductor circuits, especially large-scale microelectronic circuits, a complete circuit can contain thousands of individual transistor elements but may be less than one-quarter inch on a side. In practice, a hundred or more of such circuits can be simultaneously fabricated, side by side, on a single wafer of pure, single-crystal silicon. Typically, the silicon wafers are about twenty five thousandths of an inch in thickness and about three to four inches in diameter; however, efforts are being made to utilize even larger diameter wafers.

After the microelectronic circuits are fabricated together on a single wafer, it is conventional practice to place the wafer in a testing machine to individually test the circuits (known as "dies") before the wafer is broken into individual die, each containing a complete circuit. It is well known to accomplish such testing by use of a probing device carrying an array of fine needle-like probes which make electrical contact with the contact pads on the individual dies. The probing device is normally mounted on a computer-controlled testing machine which holds the wafer in a chuck and sequentially positions chuck relative to the the probing device so that the individual dies can be tested by establishing contact between the probes and the circuit pads of the die to be tested. Then a testing device, usually called an autotester, electrically tests the integrated circuit. If the circuit is defective, the die is marked with an ink spot or its position is otherwise recorded to indicate that the die should be discarded. The testing machine then steps to the next die and repeats the operation. Such a machine is shown, for example, in "Scientific American", Sept. 1977, page 120. Today, such machines can test a die in about 250 milliseconds (i.e., one-quarter second). When tested in such a manner as part of a complete wafer, the dies are said to be tested in wafer form.

Workers in the art have attempted to utilize such wafer-testing machines to test integrated circuits in wafer form under conditions of elevated or reduced temperature as well as ambient conditions (normal room temperature). Such testing over a range of temperatures is important because operational characteristics of integrated circuits can vary substantially with temperature, and, in some situations, an integrated circuit which is operational at room temperature may become inoperable at relatively high or low temperatures. Especially for military and aerospace applications, it is often desirable to test integrated circuits at temperatures ranging from −55° C. (−67° F.) to +125° C. (257° F.) with an accuracy of ±1° C. To accomplish such testing, workers in the art have heated or cooled the chuck which holds the wafer to bring the circuits to the desired temperature, and then tested each of the integrated circuit dies on the wafer at the elevated or reduced temperature. The procedure of utilizing the chuck to elevate or depress the temperature of a complete wafer is relatively time-consuming and can cause condensation which may result in erroneous test results. In addition, thermal gradients may exist across the chuck or wafer which interfere with the accuracy of the test results. Such effects become more acute as the temperature of testing is increased or decreased further from room temperature.

SUMMARY OF THE INVENTION

A primary object of the present invention is to provide a thermal fixture device for use with a probing device for individually testing integrated semiconductor circuits at elevated or reduced temperatures.

More particularly, an object of the present invention is to provide a thermal fixture device for use with a point-type probing device, such as a fixed-point probe card, for individually testing integrated semiconductor circuits at elevated or reduced temperatures while the circuits are still part of a complete wafer.

Yet a more particular object of the present invention is to provide a thermal fixture device for use with a probing device for individually testing integrated semiconductor circuits in wafer form at elevated or reduced temperatures ranging from about −55° C. to about +150° C.

According to the present invention, in a device for individually testing integrated circuits in semiconductor wafer form, there is provided the improvement of a thermal fixture for directing a flow of gas at a predetermined temperature onto the surface of an integrated cicruit to bring the temperature of that circuit substantially equal to the predetermined temperature of the gas. In a preferred embodiment of the invention, the fixture can direct flows of gas at a plurality of predetermined temperatures, such as operational temperature extremes for the integrated circuit and at ambient temperature.

In accordance with the foregoing, an advantage of the present invention is the provision of a thermal fixture device for use with a probing device for testing integrated semiconductor circuits at elevated or reduced temperatures.

More particulary, an advantage of the present invention is the provision of a thermal fixture device for use with a probing device for individually testing integrated semiconductor circuits at elevated or reduced temperature while the circuits are still a part of a complete wafer.

Still more particularly an advantage of the present invention is the provision of a thermal fixture device for use with a probing device for individually testing integrated semiconductor circuits in wafer form at elevated or reduced temperatures ranging from about −55° C. to about +150° C.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a side view of a wafer testing machine including a thermal fixture device according to the present invention for testing semiconductor circuits at selectively elevated and reduced temperatures; the fixture device is shown partially in section for purposes of explanation;

FIG. 2 is a top view of the fixture device of FIG. 1;

FIG. 3 is a side view of the fixture device of FIG. 2;

FIG. 4 is a top view of a component portion of the fixture device of FIG. 2;

FIG. 5 is a side view of the component of the fixture device of FIG. 4 as indicated by the arrows 5—5 in FIG. 4; and FIG. 6 is a top view of another component of the fixture device of FIG. 2, portions of which are cut away for purposes of illustration.

DETAILED DESCRIPTION OF THE PREFERRED EMBODIMENT

FIG. 1 generally shows a machine for automatically testing integrated semiconductor circuits in wafer form at selectively elevated and reduced temperatures. The machine includes a chuck 11 to hold a semiconductor wafer 13 stationary, normally by the application of vacuum, and a probing device 15 which carries probes 16. The chuck 11 is converted to a positioning device 17 for controlled sequential movement of the chuck, and hence the semiconductor wafer 13, for sequential testing of the electrical properties of the individual circuit dies formed on the wafer 13 by means of the probing device 15. In practice, the probing device 15 is preferrably of the type known as a fixed-point probe card. Further, the machine of FIG. 1 includes a thermal test fixture device, generally indicated by the number 19, having a body 20 with an open-ended aperture 23 formed generally centrally therethrough to permit visual inspection of the circuit being probed by the probing device 15. In practice, the thermal test fixture device 19 is releasably secured to the probing device 15, as by fasteners 25. The testing machine of FIG. 1 also includes a conventional optical microscope, generally designated by the number 27, having ocular tubes 28 and at least one objective lens assembly 30 for positioning over the aperture 23 of the thermal test fixture device 19 to view the individual die undergoing testing.

Referring still to FIG. 1, a transparent window 33 is sealingly mounted across the aperture 23 at a relatively substantial distance from the end of the aperture 23 in the thermal test fixture device 19 adjacent the probing device 15. For purposes of explanation herein, the face of the thermal test fixture device 19 adjacent the probing device 15 will be referred to as the bottom of the fixture, and the face of the fixture device adjacent the microscope 27 will be referred to as the top of the fixture device. Thus, it may be said that the window 33 is mounted across the aperture 23 near the top of the fixture device 19. In practice, the window 33 is formed of glass.

A plenum chamber 35 is formed within the body 20 of the fixture device 19 adjacent to the aperture 23. In practice, the plenum chamber 35 has a generally annular configuration and surrounds the aperture 23. Also formed through the body 20 are a plurality of relatively narrow and straight channels 37, herein referred to as nozzles, which are in gas-flow communication between the aperture 23 and the plenum chamber 35. More particularly, the nozzles 37 extend downwardly and at an angle toward the axial centerline of the aperture 23 such that uninterrupted streams of gas flowing from the nozzles 37 would converge at a common point on the axial centerline of the aperture 23 at or below the outlet of the aperture 23. In practice, four of the nozzles are formed in the body section 20 and are equally spaced circumferentially about the axial centerline of the central aperture 23.

Referring to FIGS. 2 and 6, a connector assembly, generally designated by reference number 41, is shown attached to the body 20 of the test device 19. The connector assembly 41 includes a block 43 having three spaced-apart channels 45, 46 and 47, respectively, formed therein parallel to one another. The channels 45, 46 and 47 receive respective gas-carrying tubes 49, 50 and 51 which extend from gas sources (not shown). The connector assembly block 43 fits flush against a planar face of the body 20 of the fixture device 19, which face is defined by a linear edge 56. The connector assembly 41 is attached to the body 20 of the thermal test fixture device 19 by latches 52. The latches 52 are conventional and are commercially available in various configurations. (In FIG. 6, the latches have been omitted.) As best shown in FIG. 2, channels 53, 54 and 55 are formed through the planar face defined by the linear edge 56 of the body 20 in gas-flow communication between the plenum chamber 35 and the inlet openings to the respective channels 45, 46 and 47 in the connector assembly 41.

Referring still to FIGS. 2 and 6, the connector assembly 41 further includes connector nipples 57, 58 and 59 sealingly mounted at the ends of the respective channels 45, 46 and 47 formed in the block 43 of the connector assembly 41. The nipple members 57, 58 and 59 sealingly engage the interior surfaces of respective cylindrical receiving recesses 61, 62 and 63 (FIG. 2) formed in the body 20 concentric with the ends of the channels 53, 54 and 55. The connector nipples 57–59 are conventional items which are commercially available, and each includes a circumferential O-ring 64 which helps provide the gas-tight seal so that gas is free to flow from the tubes 49–51 into the respective receiving channels 53–55 without leakage at the face along edge 56 between the connector assembly 41 and the body 20 of the thermal test fixture device 19. Further, the tubes 49, 50 and 51 are surrounded by a sheath 65 of insulating material, such as closed cell silicone sponge, to provide thermal insulation for hot and cold gases flowing through the tubes.

As further shown in FIGS. 2 and 3, a relatively large channel 66 is formed generally radially through the body 20 in communication with the plenum chamber 35. The function of the channel 66 is to receive a temperature sensing element (not shown) to sense the temperatures of gases in the plenum chamber 35. In practice, the temperature sensing element is sealingly mounted within the channel 66 to prevent any gases from flowing out of the plenum chamber 35 along the channel 66. Also, a recess 67 is formed in the body 20 to receive a socket member 69 for carrying electrical conductors, such as wires 73a and 73b, for connection to the temperature sensing element via channel 75 formed in the body 20.

As best shown in FIGS. 1, 4 and 6, the lower section of the body 20 of the thermal test fixture device 19 is designated by reference number 79 and has a generally disk-shaped configuration except for the linear edge 80. (In assembled condition of the thermal test fixture device 19, as shown in FIG. 1, the linear edge 80 is aligned with the edge 56 of the body 20.) As best shown in FIG. 5, the aperture 23 is defined in the body section 79 by hollow cylindrical portions 83 and 85 which extend from the respective upper and lower faces of the body section 79. The upwardly-extending cylindrical portion 83 has an outwardly-extending circular step 87 formed thereon which functions to define the bottom interior wall of the plenum chamber 35, and the spaced-apart nozzles 37 are formed through the stepped portion 87.

Referring now to FIG. 1, the circular window 33 is mounted across the upper end 89 of the upwardly-extending hollow cylindrical portion 83 within a circular recess 91 formed in the upper section of the body 20 concentrically about the centerline of the aperture 23. In practice, a sealing agent is applied to the periphery of the window 33 such that the joint between the window and the body 20 is gas-tight, thereby preventing gas from flowing past the window via the recess 91.

The function and operation of the present invention can be now readily understood. As shown in FIG. 1, the thermal fixture device 19 is fixed to the stationary probing device 15. In practice, the thermal fixture device 19 is mounted on the probing device 15 such that the end of the cylindrical portion 85 is quite close to, but not touching, the face of the integrated circuit die undergoing testing; spacing of about 100 mils is satisfactory. To complete the assemblage, the connector assembly 41 is connected to the test fixture device 19 and pressurized gas sources (not shown) are connected to the respective tubes 49-51. In practice, one of the gas sources provides low temperature gas, the second source provides high temperature gas, and the third source provides ambient temperature gas. With assemblage of the system of FIG. 1 completed, the positioning device 17 is operated to position the chuck 11 so that the probing device 15 is over a particular semiconductor circuit to be tested, and to place the metallic probes 16 in contact with selected ones of the input and output connector pads on the circuit die. The positioning of the probing device 15 with respect to the initial circuit to be tested is typically accomplished through visual inspection with the aid of the microscope 27. More particularly, the objective lens assembly 30 of the microscope 27 is positioned above the aperture 23 in the thermal test fixture 19 so that the particular die of interest can be viewed through the window 33 and, thereafter, the precise position of the probing device 15 is determined by manual manipulation of the positioning device 17. After the probing device 15 is positioned as desired, thermal testing of the die can be begun, and, after thermal testing is complete, the chuck 11 can be automatically indexed to sequentially test the other dies on the wafer 13.

To accomplish such thermal testing, gas at a particular high or low temperature is admitted through a selected one of the gas-carrying tubes 49-51. (Gas flow control means located at the gas source are conventional and, for that reason, are not shown.) If, for example, the gas is at a low temperature and is carried by tube 49 in FIG. 2, such gas passes through the channel 45 formed in the block 43 of the connector assembly 41 and then passes through nipple connector 57 and channel 53 into the plenum chamber 35. The low-temperature pressurized gas then fills the plenum chamber 35 and escapes therefrom via the nozzles 37, which generally direct the jets of gas toward a point along the axial centerline of the aperture 23 below the outlet end of the cylindrical portion 85 (FIG. 2). Thus, the cylindrical portion 85 and the nozzles 37 focus the flow of gas from the thermal test fixture device onto the particular circuit die which is to undergo electrical testing on the wafer 13.

In practice, if the examined circuit die fails the electrical tests imposed by the probing device 15 under low temperature conditions, the position of the die is recorded, and the probing device is repositioned over another die. If the die passes the electrical tests under the low temperature conditions, then the gas control system (not shown) is operated such that the flow of low temperature gas is discontinued and so that high temperature gas flows into the thermal test fixture 19, as by tube 51 in gas-flow communication with the gas-carrying channel 55. The high-temperature gas will pressurize the plenum chamber 35 and escape therefrom via the nozzles 37 to flow onto the face of the particular die being examined. The gas flow will raise the surface temperature of the die to a temperature substantially equal to the temperature of the gas. In practice, the flow of gas from the nozzle channels 27 is uniform across the face of the semiconductor circuit die undergoing testing and is sufficient in quantity to effectively exclude air from the immediate area of the face of the circuit and to remove substantially the heat energy generated by the circuit.

After the surface of the die has reached the desired high temperature, the probing device 15 is operated to perform the electrical tests upon the die, with the high temperature gas still flowing onto the surface of the die. If the die fails such high temperature tests, the location of the die will be appropriately recorded and the probing device 15 will be relocated above a different, previously-untested die. If the particular die passes the electrical tests at the high temperature, the gas control system will be operated to terminate the flow of the high temperature gas and to begin the flow of ambient temperature gas. In the preferred mode of operation, after the tests at the high temperature have been completed, gas at ambient temperature (25° C.) will be admitted to the thermal fixture test device to cool the device as well as the die which has undergone testing.

Preferrably, the gas which is utilized at all three temperatures (i.e., ambient, elevated and reduced) is clean dry nitrogen. One advantage of nitrogen gas is to minimize oxidation on the face of the integrated circuit, especially at elevated temperatures.

During the periods of testing, the temperatures of the gases within the plenum chamber 35 are continuously monitored by the temperature sensing element fixed within the channel 66. Although the temperature within the plenum chamber 35 will not exactly equal the temperature of the circuit die undergoing testing, appropriate calibration can readily establish correlation factors which correct for any thermal differences. The fact that the thermal test fixture device 19 can be utilized to accomplish accurate high or low temperature testing in relatively short time periods is predicated upon the fact that the depth of the diffusion layer for most integrated circuits is only about five to six microns and that only the diffusion layer needs to be heated or cooled to effectively test the integrated circuit at a desired high or low temperature. In other words, the above-described embodiment of the thermal test fixture device 19 heats or cools only the surface of one die at a time while the die is being probed and tested for electrical performance. Such heating or cooling can be achieved relatively rapidly and, in practice, stabilization times are typically less than one second. Furthermore, the device of the present invention does not require modification of conventional vacuum chucks or pedestals for holding semiconductor wafers and, thus, can be readily adapted for use with conventional probing devices such as fixed-point probe cards.

Accordingly, the present invention makes practical the testing of semiconductor integrated circuits in wafer form at relatively elevated or reduced temperatures. By conducting such testing while the integrated circuits are still in wafer form, a manufacturer can avoid the time and cost of packaging the circuits for testing, only to learn that they fail at the desired temperatures.

Although the present invention has been described with particular reference to the illustrated preferred embodiment, it is to be understood that such disclosure is not to be interpreted as limiting. Various other alterations, modifications and embodiments will no doubt become apparent to those skilled in the art after having read the preceding disclosure. Accordingly, it is intended that the appended claims be interpreted as covering all such alterations, modifications and embodiments as fall within the true spirit and scope of the present invention.

We claim:

1. In a device for individually testing integrated circuits which are part of a semiconductor wafer, said device being at a first temperature and having probing means for making electrical contact with individual integrated circuits, means for holding and positioning the semiconductor wafer to bring individual integrated circuits into position for contacting the probing means, the improvement comprising a thermal test fixture device having a body with an aperture therein, said body being connected to the probing means with said aperture superposing the surface of an individual integrated circuit being tested to permit visual inspection of said individual integrated circuit being tested while in electrical contact with the probing means, a plenum chamber formed in said thermal test fixture device adjacent said aperture and gas inlet means in gas-flow communication with the plenum chamber to admit a flow of pressurized gas, at a predetermined temperature different from said first temperature, from the aperture onto the surface of the circuit being tested to bring the temperature of that circuit substantially equal to the predetermined temperature of the gas while simultaneously enabling visual inspection through the aperture of the circuit being tested;

means for varying the predetermined temperature of said pressurized gas whereby the circuit being tested can be tested at different temperatures while in said position; and means for sequentially positioning individual integrated circuits of the wafers in alignment with said aperture for testing.

2. The device of claim 1 wherein said plenum chamber is a hollow cylindrical portion surrounding the aperture with interconnecting channels extending to said aperture and said body fits through the probing means to an end in close proximity with the surface of the integrated circuit being tested, the end of said hollow cylindrical portion and said integrated circuit surface having a spacing therebetween of about 100 mils during testing of the integrated circuit.

3. The device of claim 2 wherein said body has a transparent window sealingly mounted above the aperture to enable visual inspection of the ingrated circuit being tested while limiting gas flow upwardly in the aperture.

4. The device of claim 1 including a plurality of gas inlet channels for admitting pressurized gas to the plenum chamber, each gas inlet channel admitting gas at a predetermined temperature that differs from the temperature of the gas admitted through the other channels, and said body having a plurality of nozzle channels in gas flow communication between the plenum chamber and the aperture for directing gas through the aperture onto the surface of the integrated circuit being tested.

5. The device of claim 4 further including a connector assembly coupled to the body for conveying streams of gas into the plurality of gas admitting channels.

6. The device of claim 5 further including insulation means mounted to said connector assembly for thermally insulating the streams of gas entering the connector assembly.

7. The device of claim 6 wherein said connector assembly includes a plurality of tubes for conveying streams of gas therethrough; and said insulation means includes a sheath of thermal insulating material formed about the tubes.

8. The device of claim 1 including a plurality of gas inlet channels for admitting pressurized gas to the plenum chamber, each gas inlet channel admitting gas at a predetermined temperature that differs from the temperature of gas admitted through the other channels, and said body having four nozzle channels equally spaced from each other in gas flow communication between the plenum chamber and the aperture for directing gas through the aperture onto the surface of the integrated circuit being tested.

9. The device of claim 8 wherein said nozzle channels are aligned to direct gas flow towards a common point along an extended axial centerline of the aperture at a location below the body.

* * * * *